United States Patent [19]

Futatsuka et al.

[11] Patent Number: 4,668,471
[45] Date of Patent: May 26, 1987

[54] COPPER ALLOY LEAD MATERIAL FOR LEADS OF A SEMICONDUCTOR DEVICE

[75] Inventors: Rensei Futatsuka; Seiji Kumagai; Masuhiro Izumida, all of Aizuwakamatsu, Japan

[73] Assignee: Mitsubishi Shindoh Co., Ltd., Tokyo, Japan

[21] Appl. No.: 809,895

[22] Filed: Dec. 17, 1985

[30] Foreign Application Priority Data

May 8, 1985 [JP] Japan .................. 60-97589

[51] Int. Cl.$^4$ ............................. C22C 9/04
[52] U.S. Cl. .................. 420/477; 29/569 R; 148/33
[58] Field of Search .............. 420/477; 29/569; 148/33

[56] References Cited

U.S. PATENT DOCUMENTS 4,269,623 5/1981 Inoue .................. 420/477

Primary Examiner—Peter D. Rosenberg
Attorney, Agent, or Firm—Frishauf, Holtz, Goodman & Woodward

[57] ABSTRACT

A copper alloy lead material for leads of a semiconductor device, which consists essentially of from 2 to 2.4 percent by weight iron, from 0.001 to 0.1 percent by weight phosphorus, from 0.01 to 1 percent by weight zinc, from 0.001 to 0.1 percent by weight magnesium, and the balance of copper and inevitable impurities. The copper alloy lead material possesses satisfactory properties such as elongation and electrical conductivity required of a material for leads in a semiconductor device, and further exhibits excellent strength and heat resistance enough to be used as leads in semiconductor devices having high wiring densities, and at the same time possesses improved soldering reliability to the substrate of the semiconductor device as compared to a conventional copper alloy lead material.

17 Claims, 7 Drawing Figures

COPPER ALLOY LEAD MATERIAL FOR LEADS OF A SEMICONDUCTOR DEVICE

BACKGROUND OF THE INVENTION

This invention relates to a copper alloy lead material for leads in semiconductor devices, and more particularly to such a copper alloy lead material which possesses excellent strength, heat resistance, soldering reliability, etc.

A conventional method of manufacturing a semiconductor device such as an integrated circuit (hereinafter called "IC") and a large scale integration (hereinafter called "LSI") comprises, for instance, the following main processes (a)-(g):

(a) preparing a metal strip, e.g. a copper alloy strip for leads having a thickness within a range from 0.1 to 0.3 mm as a material for leads of the semiconductor device;

(b) stamping the strip for leads into a lead frame having a shape suitable for use in the semiconductor device which is to be manufactured;

(c) mounting semiconductor chips in which are incorporated elements such as semiconductor elements of high purity Si, Ga - As alloy, or the like, on the lead frame at its predetermined surface portions, either by hot bonding using a conductive resin such as Ag paste, or by thermocompression bonding through one or more plating layers of at least one metal selected from the group, consisting, e.g. of Au, Ag, and Ni which has been previously plated on the surface of the strip or the lead frame;

(d) connecting elements of the semiconductor chips to the lead frame by wire bonding using Au wires or the like;

(e) encapsulating the semiconductor chips, the wire bonding portions, the surface portions of the lead frame on which the semiconductor chips have been mounted, etc. by a plastic resin or the like for protection of same;

(f) cutting the lead frame along boundaries between adjacent ones of the semiconductor chip-mounted surface portions, to form leads of the semiconductor device; and (g) plating the whole or part of the surfaces of the leads with a solder of an Sn - Pb alloy or the like by dipping or electroplating, so as to enable soldering of the leads to the substrate of the semiconductor device.

A copper alloy material for leads of a semiconductor device is required to satisfy the following properties:

(1) Excellent stampability, as well as formability (for bending and coining);

(2) High heat resistance enough to be free of thermal strain as well as thermal softening when semiconductor chips are bonded to a lead frame stamped from the material for leads;

(3) Excellent heat radiation, i.e. electrical conductivity (since the heat radiation, i.e. the thermal conductivity is proportional to the electrical conductivity, the heat radiation can be measured in terms of electrical conductivity); and (4) High strength enough to be free of breakage during transportation of the semiconductor device or when the leads are repeatedly bent in connecting them to wiring boards during mounting of the semiconductor device into an electrical device or an electronic device.

A conventional typical copper (Cu) alloy material for leads comprising a Cu alloy consisting essentially of:
Iron: from 1.5 to 3.5% by weight;
Phosphorus: from 0.01 to 0.15% by weight;
Zinc: from 0.03 to 0.2% by weight; and
Copper and inevitable impurities: the balance,
which satisfies the required properties, has been proposed, e.g. by Japanese Patent Publication No. 45-10623 (corresponding to U.S. Pat. No. 3,522,039), and has been widely used as a material for leads of semiconductor devices.

The conventional Cu alloy material for leads possesses the following satisfactory properties:
Tensile Strength (for evaluation of the strength): of the order of 49–50 Kgf/mm$^2$;
Elongation (for evaluation of the stampability, as well as formability for bending and coining): of the order of 4%;
Electrical Conductivity (for evaluation of the heat radiation and electrical conductivity): of the order of 60-70% I.A.C.S. (International Annealed Copper Standard); and
Softening Point (for evaluation of the heat resistance): of the order of 350°–360 ° C.

However, in recent years, it has been required for materials for leads to possess further improved strength and heat resistance for use as leads, with increased wiring densities in semiconductor devices.

Further, although the above-mentioned conventional Cu alloy material for leads possesses satisfactory adhesion to the solder used in soldering the leads to the substrate of the semiconductor device, it has low soldering reliability such that when it is used as leads of the semiconductor device, the soldered portions of the leads often exfoliate or peel off from the substrate in use of the semiconductor device, which can cause malfunction of the device.

SUMMARY OF THE INVENTION

It is the object of the invention to provide a copper alloy lead material for leads in semiconductor devices, which possesses satisfactory properties such as elongation and electrical conductivity, and further exhibits excellent strength and heat resistance when it is used as leads in semiconductor devices having high wiring densities, and at the same time possesses improved soldering reliability in soldering to the substrate of the semiconductor device.

According to the invention, there is provided a copper alloy lead material for leads of a semiconductor device, which consists essentially of:
Iron: from 2 to 2.4 percent by weight;
Phosphorus: from 0.001 to 0.1 percent by weight;
Zinc: from 0.01 to 1 percent by weight;
Magnesium: from 0.001 to 0.1 percent by weight; and
Copper and inevitable impurities: the balance.

Further, according to the invention, there is provided a method of using a copper alloy as leads of a semiconductor device. The method is characterized by comprising the following steps:
(a) melting the copper alloy into a molten copper alloy having a predetermined chemical composition;
(b) preparing a material for leads from the molten copper alloy;
(c) forming the material for leads into a lead frame having a shape suitable for use in the semiconductor device which is to be manufactured;

(d) mounting semiconductor chips on the lead frame at its predetermined surface portions;
(e) connecting elements of the semiconductor chips to the lead frame by wire bonding;
(f) encapsulating at least the semiconductor chips, wire bonding portions, and surface portions of the lead frame on which the semiconductor chips have been mounted;
(g) cutting the lead frame along boundaries between adjacent ones of the semiconductor chip-mounted surface portions, to form leads of the semiconductor device; and
(h) plating at least part of surfaces of the leads by a solder, so as to enable soldering of the leads to the substrate of the semiconductor device. The copper alloy consists essentially of from 2 to 2.4 percent by weight iron, from 0.001 to 0.1 percent by weight phosphorus, from 0.01 to 1 percent by weight zinc, from 0.001 to 0.1 percent by weight magnesium, and the balance of copper and inevitable impurities.

DETAILED DESCRIPTION

Figure 1:
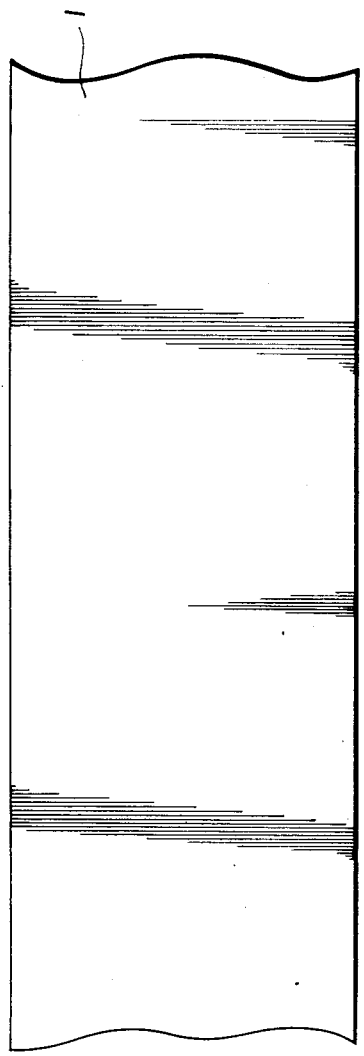
FIGS. 1-7 are plan views respectively illustrating processes of adapting a copper alloy lead material according to the invention as leads of a semiconductor device.

Under the aforestated circumstances, the present applicants have made studies in order to improve the strength, heat resistance, and soldering reliability of the aforementioned conventional Cu alloy material for leads in semiconductor devices, and have reached a finding that addition of Mg to the conventional Cu alloy lead material as an alloy component element improves the strength of the material for leads as well as the heat resistance of same, and also prevents exfoliation of the soldered portions of the leads from the substrate of the semiconductor device during actual use of the device, without the sacrifice of satisfactory properties of the conventional Cu alloy lead material such as excellent elongation and electrical conductivity.

The present invention is based upon the above finding. The copper alloy lead material for leads of a semiconductor device according to the present invention is characterized by comprising a cupper alloy consisting essentially of:
Iron: from 2 to 2.4 percent by weight;
Phosphorus: from 0.001 to 0.1 percent by weight;
Zinc: from 0.01 to 1 percent by weight;
Magnesium: from 0.001 to 0.1 percent by weight; and
Copper and inevitable impurities: the balance,
and possesses excellent strength, heat resistance, and soldering reliability.

The contents of the component elements of the copper alloy lead material for leads of a semiconductor device according to the present invention have been limited as previously stated, for the following reasons:

(a) Iron (Fe):

Iron acts to enhance the strength of the material for leads. However, if the iron content is less than 2% by weight, the above action cannot be performed to a desired extent. On the other hand, if the iron content exceeds 2.4% by weight, there can occur not only degradation in the electrical conductivity of the leads, but also formation of large precipitates of iron in the matrix of the material for leads, thus resulting in degradation in the formability of the copper alloy. Therefore, the iron content has been limited within a range from 2 to 2.4% by weight.

(b) Phosphorus (P):

Phosphorus not only acts as a deoxidizer but also acts in cooperation with the iron to form fine particles of iron phosphides dispersed in the matrix of the material for leads, to thereby improve the strength, electrical conductivity, and heat resistance of the lead material. However, if the phosphorus content is less than 0.001% by weight, the above actions cannot be performed to a desired extent. On the other hand, if the phosphorus content exceeds 0.1% by weight, the lead material can have degraded electrical conductivity as the leads. Therefore, the phosphorus content has been limited within a range from 0.001 to 0.1% by weight.

(c) Zinc (Zn):

Zinc acts as a deoxidizer, like phosphorus, and also acts to reduce variations in the strength and electrical conductivity of the material for leads, i.e. stabilize these properties of the lead material. However, if the zinc content is less than 0.01% by weight, the above actions cannot be performed to a desired extent. On the other hand, if the zinc content exceeds 1% by weight, not only the above actions cannot produce any better results but also the lead material can have degraded electrical conductivity as leads. Therefore, the zinc content has been limited within the range from 0.01 to 1% by weight.

(d) Magnesium (Mg):

Magnesium acts to improve the strength, heat resistance, and soldering reliability of the material for leads, without the sacrifice of the elongation and electrical conductivity of same as leads, as stated before. However, if the magnesium content is less than 0.001% by weight, the above acitons cannot be performed to a desired extent. On the other hand, if the magnesium content exceeds 0.1% by weight, not only the lead material can have degraded electrical conductivity as leads but also molten alloy obtained by melting the Cu alloy can have degraded fluidity, thus making the casting of the molten alloy difficult to perform. Therefore, the magnesium content has been limited within the range from 0.001 to 0.1% by weight.

Next, the manner of adapting the Cu alloy lead material according to the present invention as leads of a semiconductor device will be explained, with reference to the accompanying drawings.

Figure 2:
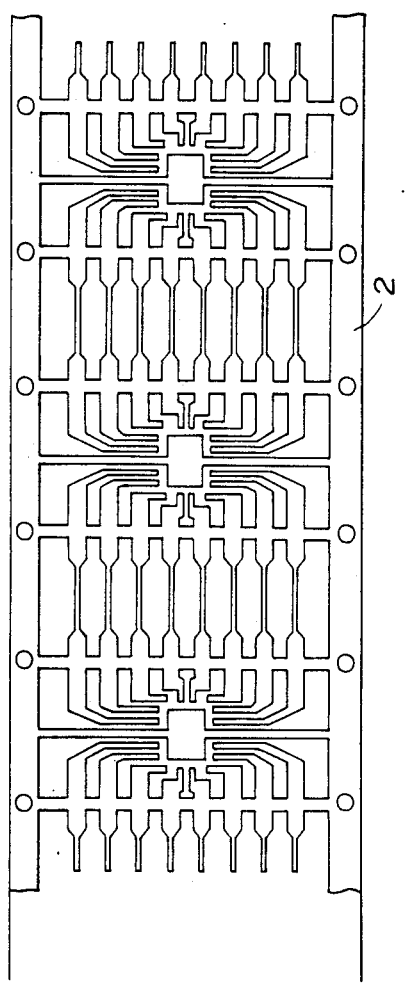
Figure 3:
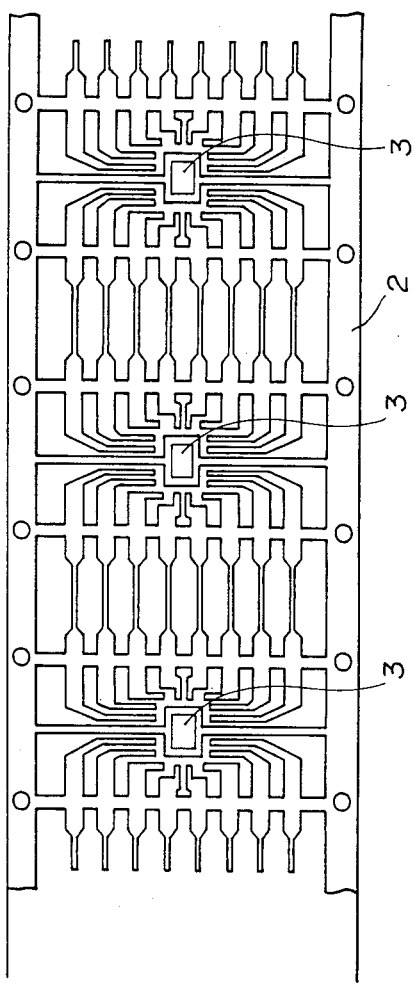
Figure 4:
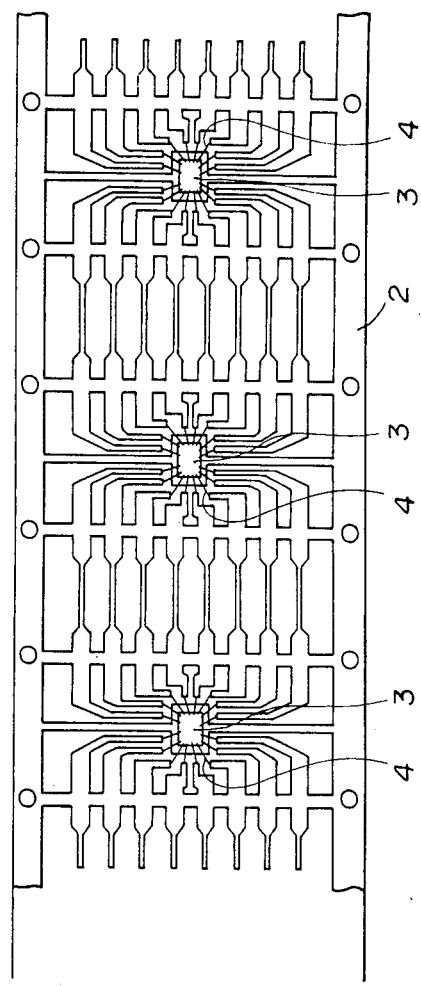
Figure 5:
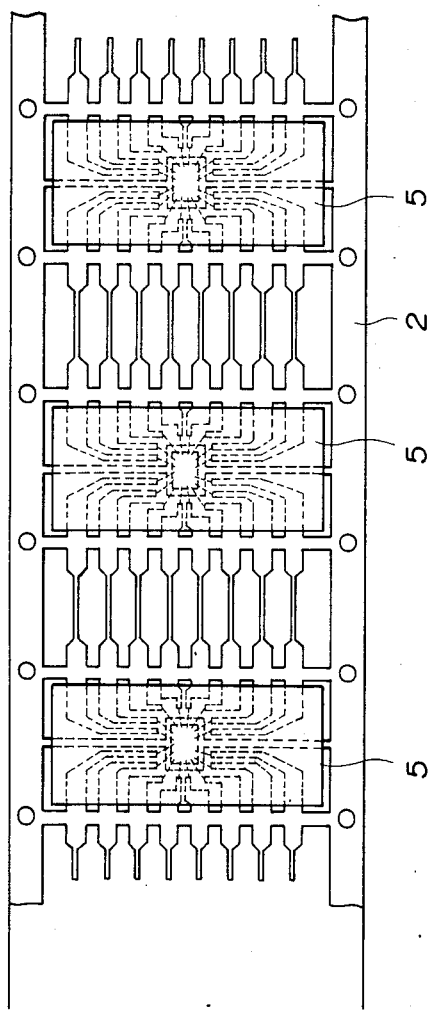
Figure 7:
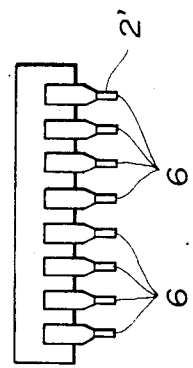
Figure 6:
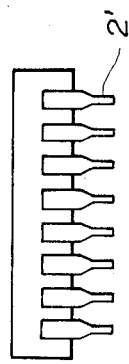

First, as shown in FIG. 1, a copper alloy lead strip 1 having a thickness within a range from 0.1 to 0.3 mm is prepared from a molten copper alloy having a predetermined chemical conposition, as a material for leads of a semiconductor device. Preferably, a major surface of the lead strip 1 may be plated with one or more plating layers of at least one metal selected from the group consisting of Au, Ag, and Ni. Then, the lead strip 1 is stamped into a lead frame 2 having a shape suitable for use in the semiconductor device which is to be manufactured [FIG. 2]. Semiconductor chips 3, in which are incorporated elements including semiconductor elements of high purity Si, Ga - As alloy, or the like, are mounted onto the lead frame 2 at its predetermined surface portions [FIG. 3], by hot bonding at a temperature within a range from 200°-350° C. using a conductive resin such as Ag paste. The semiconductor chips 3 may preferably be mounted on the lead frame 2 at its predetermined surface portions by thermocompression bonding at a temperature within a range from 300°-400° C. through the one or more plating layers. Then, elements of the semiconductor chips 3 are connected to the lead frame 2 by wire bonding using Au wires 4 [FIG. 4]. The semiconductor chips 3, the wire bonding portions, the surface portions of the lead frame 2, on which the semiconductor chips 3 have been mounted, etc. are encapsulated by a plastic resin 5 for protection of same [FIG. 5]. Then, the lead frame 2 is cut along boundaries between adjacent ones of the semiconductor chip-mounted surface portions, to form leads 2' of the semiconductor device [FIG. 6]. Finally, the whole or part of the surfaces of the leads 2' is plated with a solder 6 of an Sn - Pb alloy by dipping, to solder the leads 2' to the substrate of the semiconductor device [FIG. 7].

An example of the present invention will now be explained hereinbelow, in order to show that the copper alloy lead material according to the present invention has excellent properties as compared to the conventional copper alloy lead material.

EXAMPLE

Copper alloys having chemical compositions as shown in Table 1 were melted in an ordinary low-frequency channel type induction furnace into molten alloys, followed by casting the molten alloys, according to a conventional semicontinuous casting method into copper alloy cakes each having a size of 150 mm in thickness, 400 mm in width, and 1500 mm in length. The cakes were hot rolled at an initial hot rolling temperature of 900° C. into hot rolled plates each having a thickness of 11 mm. After being quenched, the hot rolled plates each had its both sides scalped into a thickness of 10 mm, followed by repeatedly alternately subjecting them to cold rolling and aging treatment, and then, they were subjected to final cold rolling at a reduction ratio of 70%, into lead strips each having a thickness of 0.25 mm. Then, the lead strips were annealed to relieve internal stresses at a temperature within a range from 250° to 350° C. for 15 minutes, to obtain copper alloy lead strips Nos. 1-6 according to the present invention, as shown in Table 1, as the copper alloy lead materials for leads according to the present invention; as well as a conventional lead strip as the conventional copper alloy lead material for leads, also shown in Table 1.

Then, the copper alloy lead strips Nos. 1-6 according to the present invention, as well as the conventional copper alloy lead strip were tested with respect to tensile strength, elongation, electrical conductivity, and softening point. Further, in order to evaluate soldering reliability of the lead strips, they were plated with a solder plating material having a chemical composition of Sn: 60%–Pb: 40% by dipping, heat treated under conditions simulating actual conditions in which the lead strips as leads in semiconductor devices are to be actually used, i.e. in the atmosphere, at a temperature of 150° for 500 hours.

TABLE

| SPECIMEN | | CHEMICAL COMPOSITION (WEIGHT %) | | | | TENSILE STRENGTH (Kgf/mm$^2$) | ELONGATION (%) | ELECTRICAL CONDUCTIVITY (% I.A.C.S.) | SOFTENING POINT (°C.) | EXFOLIATION OF SOLDER PLATING MATERIAL |
|---|---|---|---|---|---|---|---|---|---|---|
| | | Fe | P | Zn | Mg | Cu + IMPURITIES | | | | |
| COPPER ALLOY | 1 | 2.02 | 0.0018 | 0.012 | 0.002 | bal. | 52.1 | 5 | 64 | 410 | nil |
| LEAD STRIPS | 2 | 2.08 | 0.011 | 0.022 | 0.013 | bal. | 55.4 | 5 | 66 | 410 | nil |
| ACCORDING | 3 | 2.14 | 0.020 | 0.087 | 0.025 | bal. | 57.0 | 5 | 67 | 415 | nil |
| TO THE | 4 | 2.21 | 0.036 | 0.190 | 0.054 | bal. | 63.4 | 6 | 68 | 430 | nil |
| PRESENT | 5 | 2.32 | 0.064 | 0.680 | 0.071 | bal. | 64.4 | 5 | 65 | 440 | nil |
| INVENTION | 6 | 2.39 | 0.097 | 0.960 | 0.098 | bal. | 64.5 | 6 | 64 | 450 | nil |
| CONVENTIONAL COPPER ALLOY LEAD STRIP | | 2.37 | 0.034 | 0.125 | — | bal. | 49.7 | 4 | 65 | 360 | present |

Then, the heat treated lead strips were bent through 180 degrees, then bent back to their initial positions, and had the occurrence of exfoliation of the solder plating material from the lead strips at the bent portions checked. All the test results are shown in Table 1.

From the test results shown in Table 1, it is noted that each of the copper alloy lead strips Nos 1-6 according to the present invention possesses elongation and electrical conductivity as excellent as those of the conventional copper alloy lead strip, and at the same time possesses improved soldering reliability as compared to that of the conventional copper alloy lead strip.

As stated above, the copper alloy lead material according to the present invention possesses more excellent strength, heat resistance, and soldering reliability than those of the conventional copper alloy lead material. Further, the copper alloy lead strips Nos. 1-6 according to the present invention were tested with respect to the properties also required of a material for leads in semiconductor devices, such as elongation, electrical conductivity, stampability, etchability, platability, and soldering adhesion, and as a result, showed these properties to satisfactory extent. Therefore, the copper alloy lead material for leads of a semiconductor device according to the present invention will exhibit excellent performance not only as a material for leads in ordinary semiconductor devices, but also a material for those in semiconductor devices having high wiring densities, and it can also be used as materials for terminals and connectors of electrical and electronic devices and apparatus.

What is claimed is:

1. A copper alloy lead material. for leads of a semiconductor device, which consists essentially of from 2 to 2.4 percent by weight iron, from 0.001 to 0.1 percent by weight phosphorus, from 0.01 to 1 percent by weight zinc, from 0.001 to 0.1 percent by weight magnesium, and the balance of copper and inevitable impurities.

2. A method of using a copper alloy as leads of a semiconductor device, comprising the steps of:
   (a) melting said copper alloy into a molten copper alloy having a predetermined chemical composition;
   (b) preparing a material for leads from said molten copper alloy;
   (c) forming said material for leads into a lead frame having a shape suitable for use in said semiconductor device which is to be manufactured;
   (d) mounting semiconductor chips on said lead frame at its predetermined surface portions;

(e) connecting elements of said semiconductor chips to said lead frame by wire bonding;

(f) encapsulating at least said semiconductor chips, wire bonding portions, and said surface portions of said lead frame on which said semiconductor chips have been mounted;

(g) cutting said lead frame along boundaries between adjacent ones of said semiconductor chip-mounted surface portions, to form leads of said semiconductor device; and (h) plating at least part of surfaces of said leads by a solder, so as to enable soldering of said leads to the substrate of said semiconductor device, said copper alloy consisting essentially of from 2 to 2.4 percent by weight iron, from 0.001 to 0.1 percent by weight phosphorus 0.01 to 1 percent by weight zinc, from 0.001 to 0.1 percent by weight magnesium, and the balance of copper and inevitable impurities.

3. A semiconductor device having leads said leads comprising a copper alloy consisting essentially of from 2 to 2.4 percent by weight iron, from 0.001 to 0.1 percent by weight phosphorus, from 0.01 to 1 percent by weight zinc, from 0.001 to 0.1 percent by weight magnesium, and the balance of copper and inevitable impurities.

4. The semiconductor of claim 3 wherein said copper alloy consists essentially of from 2.02 to 2.39 percent by weight iron, from 0.0018 to 0.097 percent by weight phosphorus, from 0.012 to 0.960 percent by weight zinc, from 0.002 to 0.098 percent by weight magnesium, and the balance of copper and inevitable impurities.

5. The semiconductor device of claim 4 wherein said copper alloy contains 2.02 percent by weight iron, 0.0018 percent phosphorus, 0.012 percent zinc and 0.002 percent magnesium.

6. The semiconductor device of claim 4 wherein said copper alloy contains 2.08 percent by weight iron, 0.011 percent phosphorus, 0.022 percent zinc and 0.013 percent magnesium.

7. The semiconductor device of claim 4 wherein said copper alloy contains 2.14 percent by weight iron, 0.020 percent phosphorus, 0.087 percent zinc and 0.025 percent magnesium.

8. The semiconductor device of claim 4 wherein said copper alloy contains 2.21 percent by weight iron, 0.036 percent phosphorus, 0.190 percent zinc and 0.054 percent magnesium.

9. The semiconductor device of claim 4 wherein said copper alloy contains 2.32 percent by weight iron, 0.064 percent phosphorus, 0.680 percent zinc and 0.071 percent magnesium.

10. The semiconductor device of claim 4 wherein said copper alloy contains 2.39 percent by weight iron, 0.097 percent phosphorus, 0.960 percent zinc and 0.098 percent magnesium.

11. The copper alloy lead material for leads of a semiconductor device of claim 1 wherein said copper alloy consists essentially of from 2.02 to 2.39 percent by weight iron, from 0.0018 to 0.097 percent by weight phosphorus, from 0.012 to 0.960 percent by weight zinc, from 0.002 to 0.098 percent by weight magnesium, and the balance of copper and inevitable impurities.

12. The copper alloy lead material for leads of a semiconductor device of claim 11 wherein said copper alloy contains 2.02 percent by weight iron, 0.018 percent phosphorus, 0.012 percent zinc and 0.002 percent magnesium.

13. The copper alloy lead material for leads of a semiconductor device of claim 11 wherein said copper alloy 2.08 percent by weight iron, 0.011 percent phosphorus, 0.022 percent zinc and 0.013 percent magnesium.

14. The copper alloy lead material for leads of a semiconductor device of claim 11 wherein said copper alloy contains 2.14 percent by weight iron, 0.020 percent phosphorus, 0.087 percent zinc and 0.025 percent magnesium.

15. The copper alloy lead material for leads of a semiconductor device of claim 11 wherein said copper alloy contains 2.21 percent by weight iron, 0.036 percent phosphorus, 0.190 percent zinc and 0.054 percent magnesium.

16. The copper alloy lead material for leads of a semiconductor device of claim 11 wherein said copper alloy contains 2.32 percent by weight iron, 0.064 percent phosphorus, 0.680 percent zinc and 0.071 percent magnesium.

17. The copper alloy lead material for leads of a semiconductor device of claim 11 wherein said copper alloy contains 2.39 percent by weight iron, 0.097 percent phosphorus, 0.960 percent zinc and 0.098 percent magnesium.

* * * * *

UNITED STATES PATENT AND TRADEMARK OFFICE
CERTIFICATE OF CORRECTION

PATENT NO.  : 4,668,471
DATED       : May 26, 1987
INVENTOR(S) : FUTATSUKA et al

It is certified that error appears in the above-identified patent and that said Letters Patent is hereby corrected as shown below:

Column 8, line 24 (Claim 13): After "copper alloy"

insert --contains--.

Signed and Sealed this

Fifth Day of January, 1993

Attest:

DOUGLAS B. COMER

Attesting Officer

Acting Commissioner of Patents and Trademarks